United States Patent [19]

Shenoy et al.

[11] Patent Number: 4,734,646

[45] Date of Patent: Mar. 29, 1988

[54] METHOD FOR OBTAINING T1-WEIGHTED AND T2-WEIGHTED NMR IMAGES FOR A PLURALITY OF SELECTED PLANES IN THE COURSE OF A SINGLE SCAN

[75] Inventors: Rajendra K. Shenoy, Commack; Robert B. Wolf, Medford; Terry Morrone, Greenlawn; Raymond V. Damadian, Woodbury, all of N.Y.

[73] Assignee: Fonar Corporation, Melville, N.Y.

[21] Appl. No.: 907,895

[22] Filed: Sep. 16, 1986

[51] Int. Cl.$^4$ .............................................. G01R 33/20
[52] U.S. Cl. ..................................................... 324/309
[58] Field of Search ........................................ 324/309

[56] References Cited

U.S. PATENT DOCUMENTS

| | | | |
|---|---|---|---|
| 4,383,219 | 5/1983 | Kaplan | 324/309 |
| 4,521,733 | 6/1985 | Bottomley et al. | 324/309 |
| 4,549,139 | 10/1985 | MacFall et al. | 324/309 |
| 4,549,140 | 10/1985 | MacFall | 324/309 |
| 4,604,579 | 8/1986 | Cannon et al. | 324/309 |
| 4,616,183 | 10/1986 | Glover et al. | 324/309 |
| 4,620,154 | 10/1986 | Inouge | 324/309 |
| 4,641,095 | 2/1987 | Riederer | 324/309 |
| 4,651,097 | 3/1987 | Iwaoka et al. | 324/309 |

OTHER PUBLICATIONS

*Nuclear Magnetic Resonance Imaging in Medicine*, pp. 101, 104, 105, 108, 109, 112, 113, 116, 117, 120, 121, 124, and 125; pub. 1981, by Igaku-Shain of Tokyo; Ed. by Leon Kaufman, Ph. D., et al.; text by James M. S. Hutchison, Ph. D. et al.

Primary Examiner—Tom Noland
Attorney, Agent, or Firm—Lerner, David, Littenberg, Krumholz & Mentlik

[57] ABSTRACT

A method for obtaining in the course of a single scan T1-weighted and T2-weighted NMR imaging data for a plurality of selected planes in an object using nuclear magnetic resonance techniques. The method is accomplished by positioning an object to be imaged in a static homogeneous magnetic field and then carrying out a plurality of repetitions of a repetition sequence composed of NMR excitation and magnetic field gradient pulses for a plurality of selected planes in the object. The repetition sequences for each of the selected planes include a combination of a T1-weighted pulse sequence having a $TE_1$ and $TR_1$ suitable for obtaining T1-weighted NMR imaging data and a T2-weighted pulse sequence having a $TE_2$ and $TR_2$ suitable for obtaining T2-weighted NMR imaging data. The repetition sequence for each selected plane is repeated a plurality of times and carried out in a manner so as to encode spatial information into the collection of NMR signals. Also, the T1-weighted and T2-weighted pulse sequences for each selected plane is carried out during the recovery time intervals provided in the repetition sequence for other selected planes. In this manner, T1 and T2-weighted NMR image data for a plurality of planes are obtained in a single scan in significantly reduced time.

32 Claims, 3 Drawing Figures

METHOD FOR OBTAINING T1-WEIGHTED AND T2-WEIGHTED NMR IMAGES FOR A PLURALITY OF SELECTED PLANES IN THE COURSE OF A SINGLE SCAN

BACKGROUND OF THE INVENTION

The present invention relates to nuclear magnetic resonance magnetic resonance (NMR) imaging methods, and more particularly, to a high throughput method for obtaining in the course of a single scan T1-weighted and T2-weighted NMR image data for a plurality of selected planes in an object, thus providing significantly shorter NMR scanning times, and doing so in as convenient and efficient manner as possible.

By way of general background, the nuclear magnetic resonance phenomena occurs in atomic nuclei having an odd number of protons and/or neutrons. Due to the spin of the protons and neutrons, each such nucleus exhibits a magnetic moment, such that, when a sample composed of such nuclei is placed in a homogeneous magnetic field, a greater number of nuclear magnetic moments align with the direction of the magnetic field to produce a net macroscopic magnetization in the direction of the field. Under the influence of the magnetic field, the magnetic moments precess about the axis of the field at a frequency which is dependent upon the strength of the applied magnetic field and on the characteristics of the nuclei. The angular precession frequency, $\omega$, also referred to as the Larmor frequency, is given by the equation $\omega = \gamma B$ in which $\gamma$ is the gryomagnetic ratio (which is a constant for each particular atomic nuclei) and in which B is the strength of the magnetic field acting upon the nuclear spins.

The orientation of magnetization M can be perturbed by the application of a magnetic field oscillating at the Larmor frequency, which has the effect of rotating the magnetization away from the direction of the static field. Typically, the oscillating magnetic field is applied in a direction orthogonal to the direction of the static magnetic field by means of a radio frequency (RF) pulse through coils connected to a radio frequency transmitting apparatus. In essence, the net magnetic vector or orientation of magnetization M is rotated away from the direction of the static field. One typical RF pulse is that which has either sufficient magnitude or duration to rotate the magnetization M into a transverse plane (i.e. 90° from the direction of the static field) and is thus known as a 90° RF pulse. Similarly, if the magnitude or duration of the RF pulse is selected to be twice that of a 90° pulse, the magnetization M will change direction 180° from the main or static magnetic field.

When the RF perturbing pulse is stopped (by turning the RF transmitter off), the nuclear spins tend to slowly realign or relax back to the equilibrium position, and emit an NMR signal which can be detected with an RF receiver coil (which may, and often does, comprise the same coil used as the transmitter). The signal emitted is dependent on three basic parameters—namely, the density of the excited nuclei, the spin-lattice relaxation time (T1) and spin-spin relaxation time (T2), the latter two parameters both being exponential time constants which characterize the rate of return to equilibrium of the longitudinal and transverse magnetization components following the application of the perturbing RF pulse. These NMR parameters of spin density, T1 and T2 are related to the atomic nuclei subjected to the NMR phenomena.

Since the discovery and recognition by Damadian in the early 1970's that nuclear magnetic resonance techniques can be used to scan the human body to yield useful diagnostic information, and the subsequent development of medical NMR imaging apparatus for obtaining NMR images of the internal structures of patients, much work and effort has been expended to improve and refine the techniques for obtaining NMR images, as well as determine the diagnostic usefulness of NMR images. As a result, NMR imaging, or magnetic resonance imaging as it is sometimes known, has today proven to be an extremely useful modality to the medical community for the purposes of detecting abnormalities within the body and the subsequent diagnosis thereof. In this regard, it is known that variations in the relaxation times T1 and T2 are more closely associated with the differences between healthy and diseased tissue, and thus, from a diagnostic viewpoint, images which display or show significant T1 and/or T2 contrast have proven to be of greater diagnostic interest than those showing and displaying differences in, for example, proton density.

In the application of NMR principles to medicine and medical diagnostic imaging of live human subjects, NMR signals are obtained for a multitude of small areas in a patient, known as picture elements or pixels, and then used to construct an image or pictorial representation of a particular area of the patient being examined. More particularly, the intensity of the NMR signals are measured for the multitude of pixels, such intensity of each signal being a complex function of the tissue-related parameters used in gathering the image information. These tissue-related parameters are the spin-density of the particular nuclei being imaged (usually protons or hydrogen atoms in most medical NMR imaging applications) as well as the T1 and T2 relaxation times. For convenience of physicians and other medical personnel, the various intensity values for each of the pixels are displayed on a gray scale, in which the individual intensity values are merely a visual translation into the gray scale of the intensity values measured during the imaging scan or procedure.

In order to construct images from the collection of NMR signals, present day NMR imaging apparatus and equipment generally utilize magnetic field gradients for selecting a particular slice or plane of the object to be imaged and for encoding spatial information into the NMR signals. For instance, one conventional technique involves subjecting an object to a continuous static homogeneous field extending along a first direction and to sets of sequences of orthogonal magnetic field gradients which each generate a magnetic field component in the same direction as the static field but whose strengths vary along the direction of the gradients. In accordance with this known technique, nuclear spins in a selected plane are excited by a selective RF pulse in the presence of one of the magnetic field gradients, the frequency of the selective RF pulse corresponding to the Larmor frequency for only the selected plane of the object as determined by the magnetic field gradient imposed on the static magnetic field. Conveniently, the applied magnetic field gradient is designated the slice selector gradient. The selected plane will thus extend in a direction perpendicular to the gradient direction of the slice selector magnetic field gradient. The excited selected spins are then subjected to the other magnetic field gradients (which can be designated the read out and phase encoding magnetic field gradients), utilizing a plurality of repetitions in which the amplitude of the phase encoding gradient is varied for each repetition and in which the read out gradient is applied during the reading out of the generated NMR signals. The received NMR signals are then transformed utilizing conventional two-dimensional Fourier transform techniques. The read out magnetic field and phase encoding magnetic field gradients serve to encode spatial information into the collection of NMR signals so that two-dimensional images of the NMR signals in the selected plane can be constructed. As will be appreciated, during the scanning sequence, the various magnetic field gradients are repeatedly switched on and off at the desired intervals. Such a two-dimensional Fourier transform imaging technique and the pulse sequence for such a technique is described in the book entitled "Nuclear Magnetic Resonance Imaging in Medicine", published in 1981 by Igaku-Shoin, Ltd., Tokyo, and is sometimes known as spinwarp imaging.

Furthermore, many NMR imaging schemes today rely on the collection of spin-echo NMR signals rather than free induction decay (FID) signals. The FID NMR signals are achieved by application of a 90° RF excitation pulse and then reading out of the produced signal. In utilizing spin-echo signals, a 90° RF excitation pulse is followed by the application of a 180° rephasing RF pulse at a predetermined time interval after the 90° pulse. This produces a spin-echo signal at a corresponding time interval after the application of the 180° RF pulse. In NMR parlance, the time of the produced spin-echo NMR signal after the 90° RF excitation pulse is designated as TE (for time of echo). Thus, the 180° RF pulse is applied at a time interval of TE/2 after the 90° RF pulse.

Depending upon the NMR pulse sequences utilized in obtaining the collection of NMR signals for the various pulse sequences, the relative contribution of the different NMR parameters to the measured intensity values, and thus the NMR image, can be emphasized or deemphasized. For example, techniques are known for producing T1-weighted and T2-weighted NMR images, which are images which emphasize the T1 contributions and the T2 contributions, respectively. In this regard, T1-weighted and T2-weighted images each have different information content and have each proven useful in connection with making a diagnosis of a patient.

In a T1-weighted image, the contribution provided by the T1 parameter is emphasized which minimizes the contribution provided by the T2 NMR parameter. Thus, in connection with a T1-weighted image, the echo or data acquisition time after application of the NMR excitation pulse is chosen to be relatively small so as to minimize the effects of dephasing which is related to the T2 relaxation time. Also, the repetition interval between application of the excitation pulses is selected so as to be neither too short (to prevent complete saturation) nor too long (to prevent complete equilibrium), and thus is generally chosen to correspond to the T1 values likely to be present in the patient. A typical time interval between application of the excitation pulse and reading for a T1-weighted image is 28 milliseconds, and a typical repetition rate is between 350–600 milliseconds.

On the other hand, in connection with a T2-weighted scan, the time interval from the application of the excitation pulse to the time the data is taken is preferrably on the order of the T2 times likely to be present in the patient so as to create an appreciable difference between the nuclei population by the T2 decay process. Further, the repetition time between excitation pulses is significantly longer than the expected T1 values of the patient so that the excited nuclei will relax to their ground state before application of a subsequent excitation pulse and data acquisition. Typical values for the time interval from the initial application of the excitation pulse to data acquisition and for the repetition times for T2-weighted images are 56–112 milliseconds and 1,500–3,000 milliseconds, respectively.

Further in this regard, one of the major problems in medical NMR imaging is patient throughput. Thus, numerous efforts have been devoted to the development of techniques for obtaining images in a shorter period of time. For example, typical acquisition times for obtaining T1-weighted images are on the order of four minutes, whereas acquisition times of seventeen minutes are typical for T2-weighted images. Although various efforts have been devoted to the development of techniques for shortening the scan times, to date, they have generally resulted in a sacrifice of the diagnostic quality of the information obtained, and thus, have not yet proven satisfactory.

Still further in this regard, several techniques have been developed for producing a plurality of NMR images during the course of a single scan. For instance, multi-echo pulse techniques have been developed for the generation and collection of NMR signals from different produced echoes in the course of a single scan, which can then be used to produce several images in the same plane of the object, some of which may correspond to T2-weighted images. However, with such multi-echo techniques, although the TE time interval can be varied, the repetition rate is the same for each produced image, thus precluding the generation of truly T1-weighted images.

Also, U.S. Pat. No. 4,549,140 is directed to an NMR imaging method utilizing combined, interleaved pulse sequences for generation of computed T1 and T2 maps or images based upon sets of NMR signals at different repetition times but the same TE (or multiple of TE) time intervals for data acquisition. Such computed T1 and T2 images are not T1-weighted and T2-weighted images, however. In particular, T1 and T2-weighted images are images which are based upon a combination of the three NMR parameters of proton density, T1 and T2 but in which the T1 and T2 parameters, respectively, are emphasized to a greater extent than the other parameters, whereas computed T1 and T2 images are only dependent on, respectively, the T1 and T2 parameters alone. Furthermore, the techniques disclosed in such patent are only directed to obtaining images in a single plane of the object, and not to obtaining a plurality of images for a multitude of different planes in a manner so that the total imaging time is less than that in which the image data is obtained separately.

The technique of multi-slice imagiing has been developed for obtaining NMR images from a multiple number of planes or regions of a patient in which the nuclei in a plurality of planes or regions of the patient are excited and NMR signals read out therefrom for different regions or slices of the object during a single scan. More particularly, in multi-slice imaging, the slices or planes in the imaging volume are excited one after another during different portions of the interval between repetitions by packing an integral number of slice excitations between successive excitations in one particular plane or slice. For example, when selective RF pulses are applied in the presence of a magnetic field gradient, only a limited region of the patient is excited due to satisfaction of the resonance conditions. Accordingly, different frequencies will excite different parts of a patient. As the repetition sequence for any particular slice involves an excitation followed by reading of the produced signal and then followed by a recovery interval before applying the excitation pulse in a subsequent repetition, the nuclei in differing regions or planes can be excited during the recovery interval for one particular plane, thus efficiently utilizing the recovery time interval to selectively excite nuclei and read out NMR signals in other planes. Generally, the number of planes for which NMR images can be obtained is dependent on the recovery time interval between successive excitation pulses in a single plane and the sequence interval required for exciting and reading out of an NMR signal in one plane plus the time for switching of the gradients. For example, in connection with a spin-echo imaging sequence, the slice interval will correspond to the time necessary to apply a 90° excitation RF pulse, the apply a 180° rephasing RF pulse, to observe the echo produced thereby and to raise and lower the appropriate gradients. During the portion of a repetition sequence following the sequence time interval, additional selected planes can be sequenced utilizing different frequencies in a consecutive manner.

In accordance with present day techniques, T1-weighted and T2-weighted images are generally obtained in two separate scans, each being conducted under different pulsing repetition rates. Also, present day techniques generally require operator intervention between the respective scans. Even in connection with techniques utilizing sequence queing software for minimizing operator intervention, still there is no significant gains in patient throughput. Further, even in connection with multi-slice acquisition techniques, the number of slices or planes imaged in connection with a single scan for obtaining T2-weighted images generally are significantly higher than the number of slices or planes imaged in connection with T1-weighted scans, and therefore, additional scans must be obtained in order to obtain a corresponding number of T1-weighted images. More particularly, in connection with a T2-weighted imaging scan in which the repetition interval is 2,000 milliseconds, and in which the sequence interval for applying the 90° pulse, 180° pulse, to observe the produced echo and the time needed to raise and lower the appropriate gradients is on the order of 100 milliseconds, there is room for applying consecutive pairs of pulses and readings during the repetition sequence at twenty different frequencies and thus obtain imaging data for twenty different planes. On the other hand, in connection with a T1-weighted scan in which the sequence interval is on the order of 50 milliseconds and the recovery interval is on the order of 500 milliseconds, there is only room for ten slices.

Consequently, in conventional techniques for obtaining both T1-weighted data and T2-weighted data, not only are separate scans required for obtaining T1-weighted and T2-weighted images, but further, additional T1-weighted scans are required to obtain T1-weighted images for the same number of slices for which T2-weighted scans are obtained, thereby increasing the number of scans of the patient which must be performed and the time necessary to complete such scans. Here, it should also be appreciated that between each imaging scan which is performed on a patient, it is generally necessary to allow the patient to rest. Also, a certain amount of time is necessary when conducting a scan for operator setup, loading of information into the apparatus respecting the conditions and sequencing for collection of data, etc. Therefore, in order to obtain, using convential techniques, T2-weighted images for a plurality of planes and a corresponding number of T1-weighted images, the total scanning time is quite high, typically on the order of forty-five minutes.

Accordingly, it will be appreciated that a significant need exists for shortening the period of time for obtaining the T1-weighted and T2-weighted images, and in particular, to reduce the total acquisition time for acquiring the data and information from which T1-weighted and T2-weighted NMR images are constructed. That is, in connection with multi-slice acquisition techniques, with present day methods, variable repetition times and variable echo times can only be obtained by rescanning of a patient.

SUMMARY OF THE INVENTION

There is provided in accordance with the present invention a method for obtaining, in the course of a single scan, T1-weighted and T2-weighted image data for a plurality of selected planes in an object using nuclear magnetic resonance techniques which overcomes many of the limitations of conventional techniques for generating such data, and in particular, a method which permits the obtaining of T1-weighted and T2-weighted NMR image data in a more expeditious and convenient manner, imposing less constraints and requirements on the patient being imaged and the operator of NMR imaging equipment. More particularly, the method in accordance with the present invention broadly comprises initially positioning an object in an NMR imaging apparatus which includes means for generating a magnetic field, means for exciting selected nuclei to generate NMR signals and for reading of such NMR signals to provide a collection of NMR signals from selected regions of an object placed in the NMR imaging apparatus, and means for obtaining NMR imaging data from the collection of NMR signals. A plurality of NMR sampling operations are then conducted for at least a first selected plane and a second different selected plane of the object. The sampling operations for the first plane are commenced at a first time during the course of a single scan and continued substantially throughout the single scan so as to obtain NMR imaging data for producing T1-weighted and T2-weighted images for the first selected plane of the object. The sampling operations for the second selected plane are commenced at a second time during the course of the single scan and continued substantially throughout the single scan to obtain NMR imaging data for producing the T1-weighted and T2-weighted images for the second selected plane, the second time being later than the first time but prior to completion of the step of conducting the sampling operations for the first selected plane. Each of the plurality of NMR sampling operations include first and seconds sets of NMR excitation and reading operations, one of the first and second sets of NMR excitation and reading operations being performed in a manner to provide T1-weighted NMR imaging data and the other of the first and second sets of excitation and reading operations being performed in a manner to provide T2-weighted imaging data. Also, each of the first set of operations is performed at a different time during the course of the single scan than each of the other first set of operations and each of the second set of operations, and each of the second set of operations is performed at a different time during the course of the single scan than each of the other second set of operations and each of the first set of operations, whereby at any time during the course of the single scan only one of the first and second operations is performed.

In accordance with a preferred embodiment of the present invention, the method comprises the step of positioning an object in a static homogeneous magnetic field and then obtaining NMR imaging data for a T1-weighted image and a T2-weighted image in a plurality of selected planes by subjecting the object, for each selected plane, to a plurality of repetitions of a repetition sequence composed of NMR excitation and magnetic field gradient pulses. Each repetition sequence includes a first step (i) of applying a first excitation pulse and reading out a first NMR signal produced by the first excitation pulse at a time $TE_1$ after the first excitation pulse, and a second step (ii) of applying a second excitation pulse and reading out a second NMR signal produced by the second excitation pulse at a time $TE_2$ after the second excitation pulse. For each of the selected planes under investigation, the first and second excitation pulses are applied in a manner so as to only excite selected nuclei in the respective selected planes of the object, with the first excitation pulse being applied during the repetition sequence after a recovery time interval $TR_1$ from a preceding second excitation pulse and with the second excitation pulse being applied during the repetition sequence after a recovery time interval $TR_2$ from a preceding first excitation pulse. The repetition sequence for each selected plane is repeated at a repetition time interval $T_{rep}$ which is substantially the same for each plane and is equal to the sum of the $TR_1$ and $TR_2$ intervals. The plurality of repetitions of the repetition sequence for each selected plane are carried out in a manner to encode spatial information into a collection of the first and second NMR signals to obtain NMR image data for a T1-weighted image and a T2-weighted image for each selected plane, the $TE_1$ and $TR_1$ for each repetition sequence being selected so that the collection of the first NMR signals is representative of T1-weighted image data and the $TE_2$ and $TR_2$ being selected so that the collection of second NMR signals is representative of T2-weighted imaging data. Also, each step (i) (i.e., the step of applying a first excitation pulse and reading out a first NMR signal) for each repetition of the repetition sequence for each selected plane is carried out during the corresponding repetition of the repetition sequence for other selected planes at a different portion of the repetition time interval $T_{rep}$ for the other selected planes than the same step (i) for the other selected planes, and similarly, each step (ii) (i.e., the step of applying a second excitation pulse and reading out a second NMR signal) for each repetition of the repetition sequence for each selected plane is carried out during the corresponding repetition of the repetition sequence for other selected planes at a different portion of the repetition time interval $T_{rep}$ for the other selected planes than the same step (ii) for the other selected planes. In this manner, the pulse sequences for obtaining the T1 and T2-weighted image data for each selected plane are packed into substantially the same time interval and are each carried out at different portions of the repetition interval $T_{rep}$ intermediate the respective excitation and reading portions of the repetition sequences for other selected planes.

Thus, in accordance with the present invention, advantageous and efficient use is made of the recovery time intervals $TR_1$ and $TR_2$ in a selected plane by packing of the excitation and reading operations for other slices into the interval between successive repetitions of the same slice being investigated. In this regard, and in accordance with a preferred embodiment, for at least one of the selected planes, the step (ii) is carried out in the repetition sequence before the step (i), while for other selected planes, the step (i) is carried out in the repetition sequence prior to the step (ii). The only requirement is that only one excitation and reading operation of step (i) or step (ii) for the different selected planes be carried out at any one time during the course of a complete scan. This is accomplished by carrying out the respective steps (i) and (ii) for any selected plane during different portions of the repetition time interval $T_{rep}$ than the portions during which the steps (i) and (ii) are carried out for the other selected planes. For instance, if the sequence interval for carrying out of step (i) is $TS_1$ and the sequence interval for carrying out of step (ii) is $TS_2$ in the repetition sequence, the number of selected planes for which T1-weighted and T2-weighted image data can be obtained in accordance with the method of the present invention is equal to the largest integral number obtained by dividing $T_{rep}$ by the sum of $TS_1$ plus $TS_2$. Thus, during the course of the scan, the repetition time interval $T_{rep}$ may be divided into a plurality of sequence time intervals, each equal to $TS_1$ plus $TS_2$ and the number of sequence time intervals being equal to the number of planes for which data is to be collected. Then, during each sequence time interval, step (i) for one selected plane and step (ii) for another selected plane are carried out in sequence, e.g. step (i) being carried out in the first portion of the sequence time interval and step (ii) being carried out during a different portion of the sequence time interval.

Accordingly, with the present invention, the time required for obtaining T1-weighted and T2-weighted images for a plurality of selected planes is substantially shortened in comparison to the time required with conventional techniques in which T1-weighted imaging data is initially collected during one scan and T2-weighted imaging data is collected during a second scan of the object. Further, in accordance with the present invention, T1-weighted and T2-weighted images are collected in the course of a single scan for the same number of selected planes, which also is in contrast to conventional techniques in which at least two T1-weighted, multi-slice scans are generally necessary for obtaining T1-weighted imaging data for the same number of planes as are obtained in connection with a T2-weighted, multi-slice imaging scan. Still further, as the T1-weighted and T2-weighted NMR imaging data are obtained in accordance with the present invention during the course of a single scan, separate setup operations involving loading of pulse sequences and scanning parameters, positioning of the patient, and the like are avoided, resulting in still further additional time savings for obtaining T1-weighted and T2-weighted images for the same number of planes. A still further advantage in accordance with the method of the present invention, in which the echo times and recovery time intervals for the two sets of NMR imaging data are independently variable, is that greater image contrast variation is provided between the two sets of images in comparison to the contrast for the images obtained with standard multi-echo pulse sequences in which all of the imaging data is based on the same recovery time interval with only the echo times being varied. That is, with conventional techniques for a multiple-slice, multiple-echo NMR pulse sequence, the contrast variation in the resultant images is limited by the fact that the same recovery time interval must be used for each of the echoes in the sequence, whereas with the present invention the echo times and the recovery times are variable.

These and further features and characteristics of the present invention will be apparent from the following detailed description in which reference is made to the enclosed drawings which illustrate a preferred embodiment of the present invention.

DETAILED DESCRIPTION OF THE PREFERRED EMBODIMENT

Figure 1:
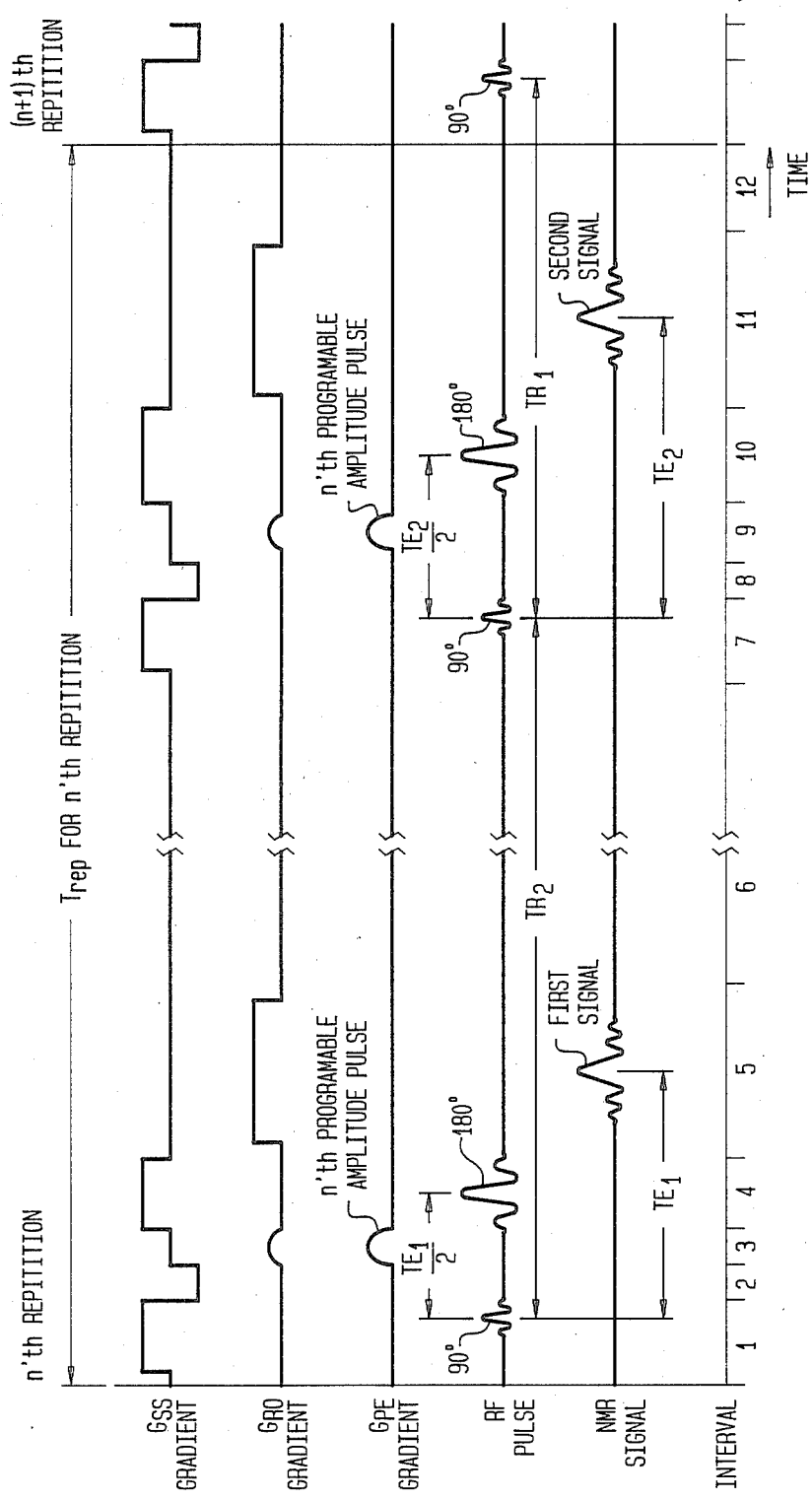
FIG. 1 is a schematic illustration of a repetition sequence in accordance with the present invention for a selected plane of the object for which NMR imaging data for T1-weighted and T2-weighted images is obtained, such figure depicting the pulse sequences for excitation and reading of the NMR signals as well as application of the slice selector, phase encoding and read out magnetic field gradients.

The present invention is directed to an NMR imaging method for obtaining T1-weighted and T2-weighted image data for a plurality of selected planes in an object, all during the course of a single scan. NMR images in general are images showing the internal structures and organs of the person along the plane or area being investigated. Such images are derived from NMR signals produced from the structures and organs at the plane being investigated, the image being a translation onto a brightness or gray scale of the measured NMR signal intensity to provide a visual display. As is well known, the NMR signals in turn are based on and dependent on NMR parameters such as spin or proton density, T1 and T2 of the particular tissue being examined. Depending on the manner in which the NMR signals are produced, the relative contributions of the NMR parameters to the image can be emphasized or de-emphasized. In this regard, differences between different types of organs and structures as well as differences between healthy and diseased tissues are more closely associated with differences in the T1 and T2 relaxation time parameters than differences in proton density. Thus, NMR images which show or display contrasts in the T1 and T2 contributions to the overall NMR image have proven to be of particular usefulness to the medical community for the purposes of detecting disease or other abnormalities and thus in the making of a diagnosis. Accordingly, T1-weighted and T2-weighted images are of particular interest as they are NMR images which emphasize contrast based upon differences in the T1 and T2 relaxation times respectively for the tissue being displayed.

As with NMR imaging in general, the method in accordance with the present invention involves the collection of a multitude of NMR signals from the patient together with information respecting the location of such signals from within the person's body in order to enable construction of the NMR images from the collected NMR signals. In this regard, the method in accordance with the preferred embodiment of the present invention employs the principles of phase encoded two-dimensional Fourier transform imaging for encoding spatial information into the collection of NMR signals. Briefly, phase encoded two-dimensional Fourier transform imaging involves carrying out a plurality of repetitions of a repetition sequence comprised of NMR excitation and magnetic field gradient pulses and reading out of produced signals to obtain a collection of NMR signals having spatial information encoded therein. Such phase encoded two-dimensional Fourier transform imaging methods are conventional in connection with many NMR imaging applications, and are described, for example, for the book entitled "Nuclear Magnetic Resonance Imaging in Medicine", published in 1981 by Igaku-Shoin, Ltd., Tokyo, Japan. Such principles will only be briefly explained and described herein, sufficient so as to enable a proper understanding of the present invention.

Also in accordance with the preferred embodiment, the NMR pulsing scheme is one for obtaining spin-echo NMR signals, and involves the application during each repetition of a 90° RF excitation pulse followed by a 180° RF rephasing pulse at a predetermined time interval after application of a 90° RF pulse. Such a scheme will then produce a spin-echo NMR signal at the same predetermined time interval after application of the 180° RF rephasing pulse. It will be appreciated, however, that an NMR imaging scheme in accordance with the present invention could also utilize free induction decay (FID) NMR signals, produced after application of a 90° RF pulse and then reading of the produced signal a predetermined time thereafter, based upon application of the various gradient magnetic fields. Still further, it should be noted that in accordance with the present invention, an NMR imaging scheme based on multiple echoes could be utilized.

Additionally, conventional averaging techniques can be employed with the NMR pulsing technique in accordance with the present invention. As is well known, it is often convenient and expedient to repeat each repetition sequence a number of times and then average the obtained NMR signals therefor to produce average NMR signals for each pixel which are then used in producing an image. While such averaging techniques are conventional, the preferred embodiment of the present invention will be described without reference to employment of any such averaging techniques.

NMR images as presently used in medicine are generally produced with an NMR imaging system which includes the basic apparatus or means for exciting selected nuclei to produce NMR signals and for then reading such signals. Also, suitable control means are provided for controlling operation of the equipment for the collection and manipulation of the imaging data.

Since such NMR imaging systems are well known and conventional, and since the present invention is directed to controlling such equipment in a particular manner to generate NMR imaging data, a particular NMR imaging system will not be described in detail herein, but instead, only a brief explanation of the nature of the equipment will be provided.

Typically, a medical NMR imaging system includes a means for generating a static homogeneous magnetic field into which the patient or other object to be imaged is placed. Such a homogeneous static magnetic field may be generated in any well-known manner, such as through the use of a permanent magnet system or through the use of a superconducting electromagnet system or a resistive magnet system. Also, as is conventional, three sets of magnetic field gradient coils are provided for applying magnetic field gradients along three orthogonal directions. In this regard, the magnetic field imposed by each of the gradient coils is in the same direction as the direction of the static homogeneous magnetic field, with the direction of the gradient of each of the magnetic field gradient coils varying along three orthogonal directions, one of which generally coincides with the direction of the magnetic field and the other two gradient directions being perpendicular or orthogonal to the direction of the main or static homogeneous magnetic field. The three gradient coils are switched on and off during the course of a scan for selection of the plane to be imaged and for encoding spatial information with the collection of NMR signals and data obtained during a scan. Conveniently, the gradient coils can arbitrarily be referred to as the slice selector magnetic field gradient coil, the read out magnetic field gradient coil, and the phase encoding magnetic field gradient coil. As such designations imply, the slice selector magnetic field gradient determines the slices or planes of the object from which imaging data is to be collected, whereas the read out magnetic field gradient and phase encoding magnetic field gradient are operative to encode spatial information for the collection of NMR signals collected from the selected slice.

It should, of course, be appreciated that the designation of the gradient coils as slice selector, read out and phase encoding is arbitrary, and that any particular gradient coil can be used as a slice selector gradient coil in one scanning sequence and used as a read out or phase encoding gradient coil in another scan. Thus, the designations of the respective gradient directions can be varied or changed for different scans so as to select different orientations of slices or planes within the object to be imaged. Further still, it should be noted that various NMR imaging techniques have also been developed in order to obtain NMR images along planes at an oblique angle to any one of the gradient directions through various combinations of switching of the various gradient coils on and off. The present invention can also be used with respect to such NMR techniques. However, for convenience in understanding the present invention, it will be assumed that the slices or planes to be imaged are perpendicular to one of the gradient directions, which will arbitrarily be designated the slice selector gradient direction $G_{SS}$, with the other two gradient directions for the read out gradient $G_{RO}$ and the phase encoding gradient $G_{PE}$ each lying in a plane perpendicular to the direction of the slice selector gradient $G_{SS}$.

Finally, before turning to the drawings, it is to be noted that in NMR parlance, TR is generally defined as the time interval between excitation pulses and corresponds to the cycle repeat or repetition time of a repetition sequence containing a single excitation pulse followed by data acquisition and thereafter a recovery time during which the excited nuclear spins relax toward the equilibrium or ground state. Depending on the type of signals to be generated, additional RF pulses may be applied during the repetition cycle. For example, in connection with free induction decay NMR imaging sequences, the excitation pulse comprises a 90° RF pulse and data is acquired at a predetermined time after application of the 90° RF excitation pulse. The timing for data acquisition can be controlled depending upon the magnitude of the application of the various magnetic field gradient pulses. On the other hand, in connection with spin-echo NMR imaging, a 180° RF pulse is applied at a specified time after application of the initial 90° RF pulse, which will produce a spin-echo NMR signal after application of the 180° RF pulse at an interval corresponding to the interval between the 90° and 180° RF pulses. Thus, if TE is taken as the time that the spin-echo NMR signal is read or sampled after application of a 90° RF pulse, the 180° RF pulse is applied at a time interval equal to one-half of TE after application of the 90° RF pulse. Also, in NMR parlance, the T1 relaxation time corresponds to time that it takes excited nuclear spins to relax to the equilibrium or ground state after being excited, whereas the T2 relaxation time corresponds to the time required for the excited nuclear spins to dephase and cancel the signals generated thereby. In this regard, T2 decay can only be determined through the application of a rephasing or inverting 180° RF pulse.

Referring now to the drawings, FIG. 1 illustrates schematically a NMR pulsing scheme in accordance with the present invention for controlling an NMR imaging apparatus for obtaining T1-weighted and T2-weighted imaging data for a selected plane of an object during the course of a complete scan. FIG. 1 illustrates not only the timing for the application of the RF excitation pulses and reading of the NMR signals produced thereby, but also illustrates the timing for application of the various magnetic field gradient pulses during such repetition sequence. As is conventional in phase encoded Fourier transform imaging, the repetition sequence shown in FIG. 1 is to be repeated a plurality of times. Typically, the number of repetitions is equal to the number of pixels (e.g. 128 or 256) that the reconstructed image will have in one direction, for example, the horizontal direction. The image pixel values can then be obtained from the collection of NMR signals using two-dimensional Fourier transform techniques, as is conventional.

In the repetition sequence of FIG. 1, it will be seen that in the first interval 1, indicated along the horizontal axis, a positive $G_{SS}$ gradient pulse is applied. The direction of the $G_{SS}$ gradient, as noted above, is arbitrarily selected to extend in a direction perpendicular to the plane or slice of the object from which data is to be collected. This direction of the $G_{SS}$ gradient could extend in the direction of the static homogeneous magnetic field, or it could extend in a direction perpendicular thereto or even at a direction oblique to the direction of the static homogeneous field.

Also in time interval 1, a selective 90° RF excitation pulse is applied in the presence of the $G_{SS}$ gradient. In this regard, the selective 90° RF pulse is one which is modulated to have a predetermined frequency content so as to excite selected nuclear spins situated in the region of the sample having the corresponding magnetic field strength (determined by the strength of the static homogeneous field plus the strength added by the $G_{SS}$ gradient) as predicted by the Larmor equation. Since resonance conditions will only be satisfied with respect to the selected nuclear spins in the selected plane, it will thus be appreciated that only those nuclear spins in the plane of the sample having a Larmor frequency corresponding to the predetermined frequency of the RF pulse will be excited by the 90° RF excitation pulse.

The $G_{SS}$ gradient is then turned off after interval 1, and the excited nuclear spins precess at the same frequency as that used to apply the 90° RF excitation pulse, but are out of phase with one another due to the dephasing effect of the gradient. The nuclear spins are rephased by the application in interval 2 of a negative $G_{SS}$ gradient pulse. Typically, the time interval of the wave form of the $G_{SS}$ gradient over interval 2 required to rephase spins is approximately equal to the negative one-half of the time integral of the positive $G_{SS}$ gradient wave form applied in interval 1.

During interval 3, a phase encoding gradient $G_{PE}$ is applied for imparting or encoding spatial information into the spins. The $G_{PE}$ gradient has a single peak amplitude which will be varied for each repetition of the sequence so that for each successive application during a different repetition, a different amplitude of the phase encoding gradient will be selected. Briefly, the gradient $G_{PE}$ encodes spatial information in one of the orthogonal directions by introducing a twist in the orientation of transverse magnetization by a multiple of $2\pi$ in such direction. Also during interval 3 (and as will be explained further hereinbelow), in order to satisfy integral conditions with respect to the subsequent application of the read out gradient, the gradient $G_{RO}$ will be pulsed on for a short interval of time.

During interval 4, a 180° rephasing RF pulse is applied for purposes of inverting and rephasing of the excited nuclear spins and to thus produce a spin-echo1 NMR signal at a time $TE_1$ after application of the initial 90° excitation RF pulse. In this regard, the 180° RF pulse is applied after the initial application of the 90° RF pulse at a time equal to one-half of $TE_1$. Thus, it will be seen that the timing of the 180° RF pulse determines the time interval $TE_1$ that the spin-echo NMR signal is generated after the initial application of the 90° RF excitation pulse. The 180° RF pulse is also applied in the presence of the slice selector magnetic field gradient $G_{SS}$, and is applied at the same frequency that the initial 90° RF pulse was applied in order to only invert the direction of the initially excited nuclear spins lying in the selected plane. Preferably, the $G_{SS}$ gradient is on for the same amount of time before and after the 180° RF pulse during interval 4.

Thereafter, a spin-echo NMR signal is generated during interval 5, and is read out in the presence of the read out gradient $G_{RO}$. The read out gradient $G_{RO}$ serves to encode spatial information along the direction of the read out gradient by causing the nuclear spins to resonate at frequencies characteristic of their locations with respect to the direction of the read out gradient $G_{RO}$. As noted above, the time of occurrence of the spin-echo signal is determined by the time that the 180° RF pulse is applied. In this regard, since the read out gradient $G_{RO}$ is switched on after the 180° RF pulse and prior to the generation of the spin-echo signal, in order to satisfy integral conditions both before and after the application of the 180° RF pulse, the read out gradient $G_{RO}$ is pulsed on a short interval of time during interval 3. The length of time that the gradient $G_{RO}$ is turned on during interval 3 is determined so that the integrated area for the gradient $G_{RO}$ before the subsequent 180° RF pulse is equal to the integrated area for the gradient $G_{RO}$ after the 180° RF pulse up to the time that the spin-echo signal is generated.

After reading out of the generated spin-echo NMR signal, the previously excited nuclei are allowed to relax during interval 6 toward their equilibrium state prior to application of further NMR excitation pulse. In this regard, the relaxation or recovery interval is conventionally measured from the initial application of the excitation 90° RF pulse in interval 1. In a conventional phase encoded two-dimensional Fourier transform imaging method, this recovery internal corresponds to the repetition interval of the repetition sequence. That is, the repetition sequence consists of application of an NMR excitation pulse, application of a rephasing pulse for spin-echo imaging, reading out of the spin-echo NMR signal and a recovery interval during which the nuclear spins are allowed to relax or recover toward their equilibrium or ground state. Thereafter, the sequence is repeated with the application of a subsequent set of NMR pulses at the predetermined repetition rate. Thus, a conventional phase encoded, two-dimensional Fourier transform technique would correspond to intervals 1–6 as shown in FIG. 1.

However, in accordance with the present invention, before repeating of the same sequence as described above for the application of the first excitation 90° RF pulse, the rephasing 180° RF pulse, and the application of the read out and phase encoding gradient pulses, a second NMR pulse sequence, utilizing a different repetition rate and a different sequencing of the 90° and 180° RF pulses, and corresponding reading out of a different NMR signal, is carried out. In other words, the repetition sequence in accordance with the present invention, which is to be repeated a plurality of times, includes two sets of NMR excitation and collection of imaging data sequences.

Thus, referring to FIG. 1, a second 90° RF pulse is applied in interval 7, again in the presence of the slice selector gradient $G_{SS}$ and again applied with a predetermined frequency so as to only excite selected nuclei lying in the selected plane. The frequency for the second RF pulse is the same as for the first 90° RF pulse in interval 1 so that the same set of nuclei are selectively excited. After the second 90° RF pulse is applied in the presence of the slice selector gradient $G_{SS}$, the nuclear spins are rephased by application in interval 8 of a negative $G_{SS}$ gradient pulse. Next, in interval 9, a phase encoding gradient pulse $G_{PE}$ similar to that for the first sequence in interval 3, is applied so as to have a single peak amplitude during each successive repetition application to thereby encode spatial information in the phase encoding direction. Also, the read out gradient $G_{RO}$ is applied during interval 9 in order to satisfy integral conditions.

At a predetermined time interval after application of the second 90° RF pulse, a 180° rephasing RF pulse is applied in interval 10 in the presence of the $G_{SS}$ gradient in order to invert the nuclear spins and thereby produce a spin-echo NMR signal in interval 11. The 180° RF pulse is applied at the same frequency as the other RF pulses in the repetition sequence.

The time interval $TE_2$ is different from the time interval $TE_1$ used with respect to the first NMR pulsing sequence. The second spin-echo NMR signal is read out in the presence of the $G_{RO}$ read out gradient in interval 11, as was the case with respect to the first NMR signal in interval 5 in the repetition sequence. Thereafter, the nuclear spins are allowed to recover during interval 12 before starting of a subsequent repetition of the repetition sequence.

The interval of time between the application of the first 90° RF pulse and the second 90° RF pulse in the repetition sequence is designated $TR_2$, and the time interval between application of the second 90° RF pulse in the repetition sequence and a first 90° RF pulse in the next succeeding repetition of the repetition sequence is designated $TR_1$. It will thus be appreciated that the overall repetition rate of the repetition sequence, $T_{rep}$, is equal to $TR_2$ plus $TR_1$. Also, as will be explained more fully hereinbelow, the intervals $TR_1$ and $TR_2$ are different from one another.

The designation $TR_2$ as the time interval between the first 90° RF pulse and the second 90° RF pulse in the repetition sequence corresponds to the time period that the nuclei have to relax from a preceding RF excitation pulse before application of the second 90° RF pulse in the repetition sequence, and thus determines how far the excited nuclei have relaxed back toward the ground or equilibrium state before being excited by the second 90° RF pulse. Consequently, the $TR_2$ corresponds to the recovery interval for the second NMR pulsing sequence in time intervals 7–12 of FIG. 1, and is thus the reason for the designation of this recovery interval as $TR_2$. Similarly, the designation $TR_1$ as the interval between a second 90° RF pulse in one repetition and a first 90° RF pulse in an subsequent repetition corresponds to the recovery interval for the first NMR pulse sequence in time intervals 1–6 of FIG. 1, and thus is the reason for the designation of this recovery interval as $TR_1$.

Thus, it will be appreciated that in accordance with the method of the present invention, each repetition sequence for a selected plane or slice includes two operations of exciting selected nuclei in the selected plane and then reading out of the produced first and second NMR signals, the first and second NMR signals being read out at different time intervals $TE_1$ and $TE_2$, respectively, after the respective selective excitations, and the respective excitations within a repetition sequence being spaced from one another so that the first 90° RF excitation pulse occurs at interval $TR_1$ after a preceding second 90° RF excitation pulse and the second 90° RF excitation pulse being applied at a time $TR_2$ after a preceding first 90° RF excitation pulse. Further, the overall repetition interval $T_{rep}$ for each repetition sequence is equal to the sum of $TR_1$ plus $TR_2$.

Also, it will be appreciated from the discussion hereinabove that during the application of the 90° RF excitation pulses in intervals 1 and 7, the waiting intervals 2–3 and 8–9 before application of the 180° rephasing RF pulses in intervals 4 and 10, and the reading out of the spin-echo NMR signals in intervals 5 and 11, the various magnetic field gradients are switched on and off in a manner similar to the manner employed in conventional NMR imaging utilizing phase encoded two-dimensional Fourier transformations. The only difference is that there are two sets of operations of switching the various gradients $G_{SS}$, $G_{PE}$ and $G_{RO}$ on and off in light of the two NMR sequences of excitation and reading out of NMR signals in each repetition sequence.

In accordance with the present invention, one of the NMR sequences of exciting selected nuclei and reading out of produced NMR signals is operative to generate T1-weighted NMR imaging data and the other NMR sequence is operative to generate T2-weighted NMR imaging data. Thus, each repetition sequence as shown in FIG. 1 includes a first portion directed to collection of NMR signals for T1-weighted NMR images and a second portion directed to collection of NMR signals for T2-weighted NMR images, the plurality of repetitions of the repetition sequence of FIG. 1 serving to provide a collection of NMR signals for T1-weighted NMR images and a collection of NMR signals for T2-weighted NMR images. In terms of the schematic illustration of FIG. 1, the first NMR sequence in intervals 1–6 is carried out so as to produce T1-weighted imaging data and the second sequence in intervals 7–12 is carried out to produce T2-weighted imaging data. However, and as will be apparent hereinbelow, the ordering of the NMR pulsing sequences could be reversed.

In this regard, in a T1-weighted NMR imaging scan, the recovery time, generally TR, between excitation pulses is chosen so as to correspond to about the same time as the T1 values likely to be present in the patient. Thus, in a T1-weighted scan, portions of the patient which have short T1 values will provide a strong signal and portions which have a long T1 will provide a weak signal. Consequently, a T1-weighted NMR image displays T1 contrast. Also, if the TE is short in comparison to the T2 values likely to be present in a patient, the data will be taken before T2 decay sets in and the image will be independent of the T2 values in the patient. Therefore, in connection with T1-weighted NMR images, it is preferrable that the echo time, generally TE, be short. On the other hand, in a T2-weighted scan, which is to display T2 contrast, a longer TE is utilized, as well as a very long TR. A long recovery time TR is utilized in order to allow the excited nuclei a change to relax back to the equilibrium or ground state before application of a second NMR pulse so that the signal amplitude will be independent or insensitive to the T1 values. Typically, in connection with a T1-weighted NMR image, the TE time is on the order of 14–28 milliseconds and the recovery or repetition time interval is on the order of 350–600 milliseconds, whereas in connection with a T2-weighted scan, the TE is much greater, for example, 56–112 milliseconds, and the TR likewise is very much greater, on the order of 1,500–3,000 milliseconds. Thus, it will be appreciated that T1-weighted NMR imaging scans have different TE's and different TR's than those for T2-weighted NMR imaging scans. Further, T1-weighted NMR images and T2-weighted NMR images thus have different information content and are both considered useful in connection with diagnosing disease or illness in a patient.

In conventional NMR imaging, T1-weighted and T2-weighted images are obtained with separate scans of a patient. In particular, the TE and TR times are fixed for each of the repetitions of the repetition sequence, and it is only possible to obtain either T1-weighted NMR images or T2-weighted NMR images in a single scan. Even in connection with multi-echo NMR imaging, in which multiple echoes are produced with each RF excitation pulse (by the application of a series of 180° inverting RF pulses following the initial 90° RF pulse), still the same overall repetition or recovery time TR is used for each of the various echoes for which data is being collected. Thus, while a plurality of NMR signals are read out during each repetition sequence, corresponding to different TE's, still the same overall repetition rate is utilized for each NMR signal which is read out, and accordingly, T1-weighted and T2-weighted imaging data cannot be obtained in a single scan.

As can be appreciated, the fact that separate scans must be conducted in order to obtain both T1-weighted and T2-weighted images, thereby requiring operator intervention between the various scans, serves to significantly increase the time for obtaining the desired T1-weighted and T2-weighted images. Even if operator intervention is avoided by sequence queing software, there generally are no significant gains in patient throughput since the patient must still rest between scans. Further, in connection with multi-slice imaging scans, the number of slices in a T2-weighted scan are generally greater than those achieved in connection with a T1-weighted scan. This is for the reason that in connection with multi-slice NMR sequencing, the number of different or selected planes of a patient excited by different frequencies of RF pulses are generally much less for T1-weighted imaging scans than for T2-weighted imaging scans. Thus, in order to obtain T1-weighted images for the same number of planes for which T2-weighted images were obtained, it has been necessary to conduct a plurality of T1-weighted multi-slice scans for each T2-weighted multi-slice scan.

On the other hand, in accordance with the repetition sequence utilized in the present invention, it will be appreciated that the TE's and TR's for each of the NMR pulse sets in the repetition sequence can be varied as desired so that true T1-weighted and true T2-weighted NMR images can be obtained. For example, referring to FIG. 1, the echo time $TE_1$ can be chosen to be 28 milliseconds and the recovery time interval $TR_1$ chosen as 500 milliseconds with the echo time $TE_2$ chosen as 84 milliseconds and the recovery time interval $TR_2$ chosen as 1,750 milliseconds. In this manner, the first 90° RF excitation pulse in the repetition sequence shown in FIG. 1 will generate a first NMR spin-echo signal representative of T1-weighted imaging data having a short TE (28 milliseconds) and an intermediate recovery interval (500 milliseconds), and a second NMR signal representative of T2-weighted NMR imaging data having a long TE (84 milliseconds) and a very long TR (1,750 milliseconds). Thus, it will be appreciated that in accordance with the present invention, the repetition sequence comprises the stringing together of two NMR excitation and reading operations during a single repetition, each of the NMR excitation and reading operations having a different TE and a different TR, such that one of the NMR excitation and reading operations will produce T1-weighted NMR imaging data and the other will produce T2-weighted NMR imaging data. In this regard, the repetition sequence having the two sets of NMR excitation and reading operations are repeated a plurality of times during the course of a scan so that the T1-weighted and T2-weighted imaging data are collected during the course of a single scan.

Here it should be understood that the particular examples of a $TE_1$ of 28 milliseconds and $TR_1$ of 500 milliseconds for T1-weighted imaging data and a $TE_2$ of 84 milliseconds and $TR_2$ of 1,750 milliseconds for T2-weighted imaging data are not mandatory for T1-weighted and T2-weighted NMR imaging data, but rather, as is known, there is a range of latitude which can be employed for such parameters to produce T1-weighted and T2-weighted NMR imaging data. Typical ranges for the spin-echo times and recovery intervals for T1-weighted NMR images are a $TE_1$ of 14 to 28 milliseconds and a $TR_1$ of 200 to 600 milliseconds, whereas typical spin-echo times and recovery intervals for T2-weighted NMR images are a $TE_2$ of 56 to 112 milliseconds and $TR_2$ of 1,500 to 3,000 milliseconds.

Before considering the use of the repetition sequence described above in connection with multi-slice or multi-plane imaging, it is useful to understand the general principles employed in connection with obtaining NMR imaging data in the course of a complete scan for a multiple number of selected planes in an object to be imaged. Briefly, multi-slice imaging techniques are known in which efficient use is made of the recovery time interval in a repetition sequence for one plane in order to obtain NMR signals and information from a multiple number of planes. This is accomplished by taking advantage of the fact that different frequencies of the RF pulses, in the presence of a slice selector magnetic field gradient, serve to only excite the selected nuclei in different planes or parts of the object. In other words, in the presence of a slice selector magnetic field gradient, different planes within the object have different Larmor frequencies such that each different frequency for the RF pulses will excite only selected nuclei in a different plane. Thus, a first frequency $f_1$ for the RF excitation pulses will excite only those nuclei lying in a first plane, whereas a different frequency $f_2$ for the RF excitation pulses will excite only the selected nuclei in the second plane, and so forth. Since NMR signals will only be generated by the excited nuclei, and since NMR signals will only be read out at selected times after an excitation, by prudently choosing the time of application of the different RF excitation pules at different RF frequencies and reading out of the produced NMR signals, the different NMR signals generated by the different frequencies will only represent NMR signals from different planes within the object.

As the recovery time before reapplying an excitation pulse in connection with NMR images is generally long in comparison to the time needed to apply the excitation pulse, the rephasing RF pulse, and the reading of the signals (together with the time needed to switch the appropriate gradients on and off), it is apparent that NMR signals can be generated and read out for a number of planes within the overall repetition time interval. For example, it is convenient to let $T_{slice}$ represent the sequence time interval needed for a single slice to apply a 90° RF pulse, at 180° rephasing RF pulse, to read out the spin-echo signal and the time needed to raise and lower the appropriate gradients. The number of slices or planes for which imaging data can be obtained is thus equal to the largest integral number obtained from dividing the repetition rate TR by the sequence time interval $T_{slice}$.

Thus, in conventional multi-slice imaging, during a first sequence interval $T_{slice}$ of a repetition sequence, a 90° RF excitation pulse, and a 180° rephasing pulse are applied at a first frequency $f_1$ and the produced spin-echo signal then read out. This NMR signal will be representative of an NMR signal for nuclei in a first plane. Thereafter, during the recovery interval for the excited nuclei in the first plane, another sequence of a 90° RF excitation pulse, a 180° rephasing pulse and reading out of the spin-echo NMR signal, with appropriate switching of the gradients, is carried out during a second sequence interval $T_{slice}$. This latter signal is representative of NMR signals for nuclei in the second plane. Thereafter, subsequent sequences of excitation, rephasing and reading out of NMR signals are carried out for other planes in subsequent sequence intervals $T_{slice}$, while the excited nuclei in the first two planes are relaxing during their respective recovery intervals.

Thus, in a multi-slice NMR imaging method, consecutive sets of pulses and reading out of signals, at different frequencies, can be accomplished in one repetition time interval TR. In particular, the various slices or planes in the object being imaged are excited one after another, at the appropriate sequence interval, with the overall repetition rate for one slice being utilized to pack in an integral number of slice intervals between successive excitations of the same slice. Here is is to be noted that each of the RF excitation and rephasing pulses is applied at a different frequency so as to excite a different section or plane of the patient. A single frequency only repeats itself once for each plane during the repetition time interval TR.

Typically, the sequence time interval $T_{slice}$ for a T2-weighted scan is on the order of 60–120 milliseconds, for example 100 milliseconds, whereas the sequence time interval $T_{slice}$ for a T1-weighted scan is on the order of 30–60 milliseconds, for example 50 milliseconds. Since the TR for a T2-weighted NMR scan is, for example, 1,750 milliseconds, there is room within a repetition to carry out 17 sequences of 100 milliseconds each, which is the largest integral number obtained by dividing 1,750 by 100. On the other hand, with respect to a typical T1-weighted scan having a $T_{slice}$ of 50 milliseconds and a TR of 500 milliseconds, there is room for carrying out 10 sequences in the repetition time interval TR of 500 milliseconds. Also, it will be appreciated that in connection with a T1-weighted scan, if the sequence period or interval is greater, a fewer number of slices are permitted.

It will thus be appreciated that in connection with multi-slice imaging in a conventional manner, in which separate scans are utilized for obtaining T1-weighted images and T2-weighted images, the number of slices for a typical T2-weighted imaging scan may be on the order of 15–30 slices (since TR is 1,500–3,000 milliseconds), whereas the typical number of slices for a T1-weighted imaging sequence in a complete scan is on the order of 4–12 slices. Thus, in order to obtain T1-weighted and T2-weighted images for the same number of slices, typically, it is necessary to perform one T2-weighted imaging scan and at least two T1-weighted imaging scans. As can be appreciated, this necessarily increases the scanning time for a patient particularly when it is considered that between each scan the patient must rest, new NMR sequences must be loaded into the NMR imaging apparatus, etc. A typical scanning time for a multi-slice T2-weighted NMR image scan is 17 minutes, and four minutes for each multi-slice T1-weighted scan. Typically, the overall time for accomplishing same is on the order of 45 minutes.

In accordance with the present invention, T1-weighted and T2-weighted images are obtained for the same number of planes, requiring less time for the collection of the NMR signals for the T1 and T2-weighted images. Also, since only one scan is necessary, additional time is not required for setting up the controls and electronics to perform additional scans. Furthermore, the imaging data can conveniently be presented showing T1-weighted and corresponding T2-weighted images of each slice at the same location, without having to insure that the patient is properly positioned for additional scans. Instead, with the present invention, only a single scan is required, placing a slight additional demand on the patient for the single scan, but requiring less demand overall since only one scan need be taken.

Figure 2:
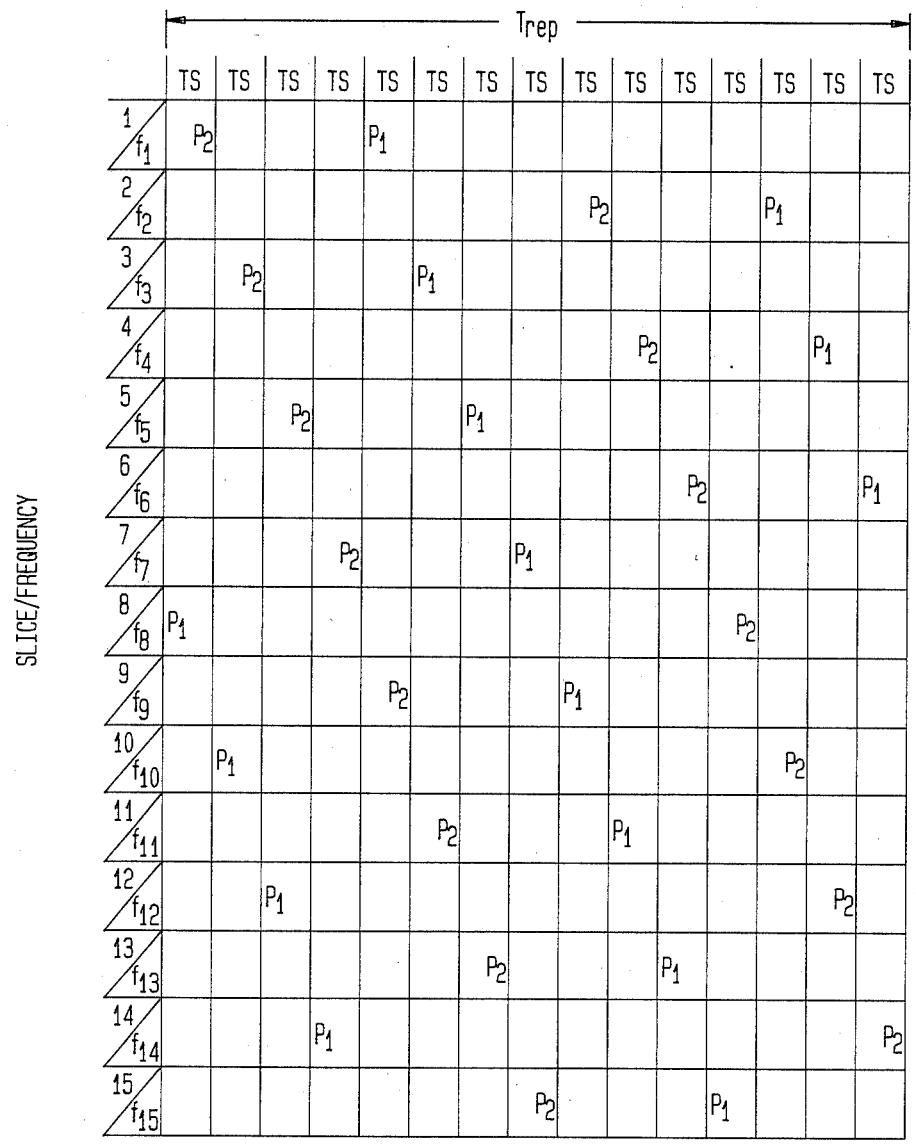
FIG. 2 is a schematic illustration depicting the timing of the pulse sequences during one repetition time interval for obtaining T1-weighted and T2-weighted NMR imaging data for each of a plurality of selected planes in accordance with the present invention, the repetition time interval being divided into a plurality of sequence time intervals, and $P_1$ and $P_2$ representing the respective pulse sequences for obtaining T1-weighted and T2-weighted image data.

Referring to FIG. 2, in accordance with the present invention, there is shown a schematic diagram of the scheme for exciting selected nuclei in each of the representative planes and for collecting the NMR imaging data from the respective planes in a multi-slice of multi-plane technique for one repetition interval utilizing the repetition sequence discussed hereinabove with reference to FIG. 1. In FIG. 2, the overall repetition interval $T_{rep}$ (along the horizontal axis) has been divided into 15 equal time slice intervals 1–15. These individual intervals 1–15 in FIG. 2 do not, however, correspond to the intervals 1–12 shown in FIG. 1. The vertical axis represents the number of slices or planes for which imaging data is to be collected, and similarly has been labeled 1–15 to represent 15 different planes. Thus, imaging data for T1-weighted and T2-weighted scans is to be obtained for 15 different planes or slices of an object during each repetition. Also, since the number of planes correspond to the number of different frequencies for the RF pulses, the vertical axis in FIG. 2 has also been labeled with frequencies $f_1$-$f_{15}$.

In FIG. 2, the term P1 is utilized to represent the operations for exciting selected nuclei and reading out of the generated NMR signal (together with the operations for switching on and off of the appropriate gradient coils) in connection with obtaining T1-weighted image data, whereas the term P2 represents the operations for exciting selected nuclei and reading out of the generated NMR signals (together with the operations for application of the appropriate gradients) in connection with obtaining T2-weighted image data. In this regard, there is one P1 operation and one P2 operation for each of the selected planes during the overall repetition interval $T_{rep}$, each P1 operation being carried out so that the 90° RF excitation pulse therefor is applied at a time $TR_1$ (e.g. 500 milliseconds) following the application of the 90° RF excitation pulse for a preceding P2 operation, and each P2 operation being carried out so that the 90° RF excitation pulse is applied at a time $TR_2$ (e.g. 1,750 milliseconds) following application of the 90° RF excitation pulse for a preceding P1 operation. As noted hereinabove, in accordance with the present invention, $TR_1$ corresponds to the recovery period for a T1-weighted image and, for example, is 500 milliseconds, whereas $TR_2$ corresponds to the recovery period for a T2-weighted image and, for example, is 1,750 milliseconds. Thus, referring to FIG. 1, each P1 operation corresponds to the operations in intervals 1–5 of FIG. 1 for application of the first excitation pulse and reading out of the first NMR signal thereafter at a time $TE_1$ suitable for a T1-weighted image (e.g. 28 milliseconds). Similarly, each P2 operation corresponds to the operations in intervals 7–11 in FIG. 1 for application of the second 90° RF excitation pulse and reading out of the second NMR signal thereafter at a time $TE_2$ suitable for a T2-weighted image (e.g. 84 milliseconds).

In connection with the preferred embodiment of the multi-slice imaging sequence method of the present invention, the P1 and P2 operations for each slice within the overall repetition interval $T_{rep}$ are arranged or carried out so that the P1 operation for each slice or plane occurs at a different portion of the overall repetition interval $T_{rep}$ than each P2 operation and each other P1 operation for the other slices, and the P2 operation for each slice is carried out during a different portion of the overall repetition interval $T_{rep}$ than each other P2 operation and each P1 operation. In other words, in accordance with the preferred embodiment, at any one instant during a repetition interval, only one P1 or P2 operation, i.e. a sequence of excitation and reading operations, is performed. In this regard, however, it should be noted that it is possible in a multi-slice technique to perform NMR excitation operations for different planes at the same time so long as the reading operations for the different planes are performed at different portions of the overall repetition interval $T_{rep}$. That is, at any one time during the overall repetition interval, only one reading operation can be performed. Thus, it is possible that portions of the $P_1$ and $P_2$ operations could overlap.

This is accomplished in accordance with the present invention by dividing the repetition inerval $T_{rep}$ into a series of time intervals TS whose length is equal to the interval for a P1 pulse sequence plus a P2 pulse sequence. Thus, assuming that the sequence time intervals for the P1 and P2 operations are, respectively, $TS_1$ and $TS_2$, the total sequence time interval TS is equal to $TS_1$ plus $TS_2$, and corresponds to the time for application of both operations P1 and P2. Then, during each sequence interval TS, one P1 operation and one P2 operation, but for different slices, are carried out. Also, the P1 operation for one slice is carried out during a different portion of the sequence interval TS than the P2 operation for a different slice. Further, as the repetition time interval $T_{rep}$ is equal to $TR_1$ plus $TR_2$, the number of slices for a multi-slice sequence in accordance with the present invention is equal to the largest integral number obtained by dividing $(TR_1 + TR_2)$ by $(TS_1 + TS_2)$. For example, assuming that $TS_1$ equal 50 milliseconds and $TS_2$ equal 100 milliseconds, and $TR_1$ is 500 milliseconds and $TR_2$ is 1,750 milliseconds, in a multi-slice sequence there is room for 15 slices.

Thus, referring to FIG. 2, it is seen that for slice No. 8 (corresponding to frequency $f_8$) during the first portion of the first TS time interval, a P1 sequence is carried out, whereas for slice No. 1 (corresponding to frequency $f_1$), a P2 sequence is carried out during the latter portion of the first TS time interval. This scheme can then be carried out with respect to each of the TS intervals 1–15, as is apparent from FIG. 2. That is, during each TS interval, a P1 operation for one slice is performed during the initial portion of the TS interval, and a P2 operation for a different slice is performed during the latter part of the TS interval. Also, only one P1 operation and one P2 operation is carried out during each TS interval.

Figure 3:
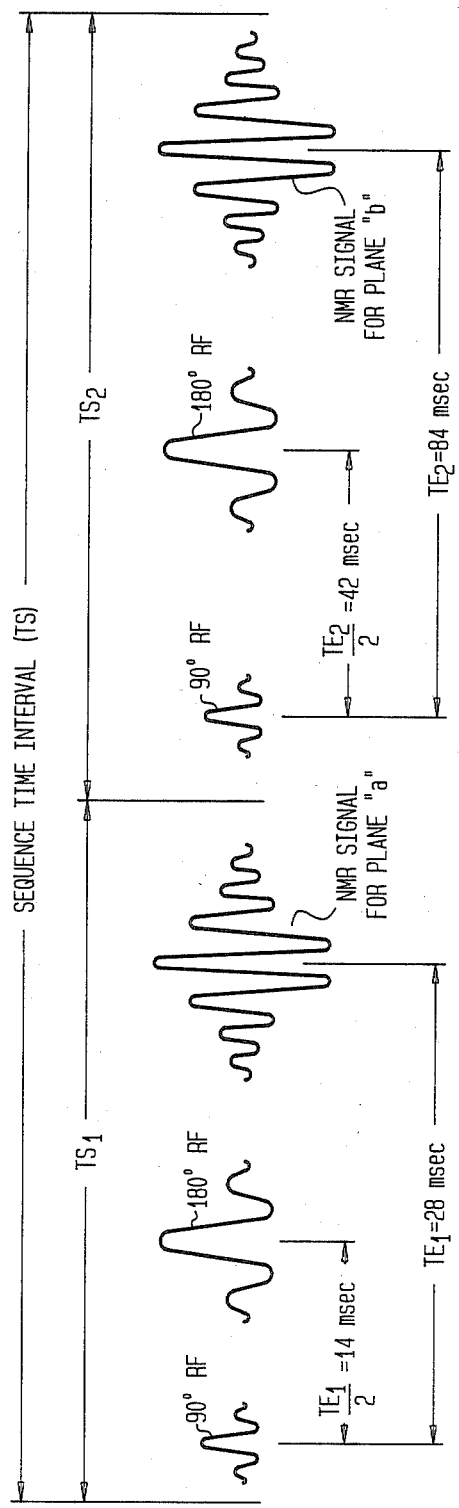
FIG. 3 is a schematic illustration depicting the respective pulse sequences during a sequence time interval for obtaining T1-weighted image data in one selected plane and T2-weighted image data in a different selected plane.

In this regard, FIG. 3 illustrates schematically the ordering of a P1 operation and a P2 operation for different slices "a" and "b", respectively, during a TS time interval. From FIG. 3, it will be seen that the portion of the time interval TS for carrying out a P1 operation for one plane "a" corresponds to $TS_1$, the time necessary to excite selected nuclei by applying a 90° RF pulse, to rephase the excited nuclei by application of a 180° RF pulse and to then read out of the produced NMR signal at an echo time $TE_1$ after the 90° RF pulse, together with the time necessary for appropriately switching of the gradient coils on and off. Similarly, the portion of the time interval TS for carrying out a P2 operation for a different plane "b" corresponds to $TS_2$, which is the time needed to apply a 90° RF pulse to excite the selected nuclei, apply a 180° RF pulse to rephase the excited nuclei and to read out the produced NMR signal at a time $TE_2$ after applying the 90° RF pulse, plus the time needed to switch the gradient coils on and off. Since TS is equal to $TS_1 + TS_2$, there is sufficient time within the interval TS for carrying out a P1 operation for slice "a" followed by a P2 operation for a different slice "∓b".

In this regard, the reason for the requirement that only one P1 or P2 operation be carried out at a time can be understood with reference to FIG. 1. Each of the operations P1 and P2 involves an excitation operation involving application of a 90° RF pulse, followed by a rephasing 180° RF pulse and then reading out of the produced NMR signal. During this sequence of operations, the various gradients $G_{SS}$, $G_{PE}$ and $G_{RO}$ are switched on and off at appropriate predetermined time intervals, as is apparent from FIG. 1, in order to enable proper selective excitation and proper spatial encoding. There can only be appropriate switching on and off of the gradients $G_{SS}$, $G_{PE}$ and $G_{RO}$ for one pulsing sequence P1 or P2 at any instant of time for any one slice of the object, since there is only one set of gradient and transmitter/receiver coils in an NMR imaging apparatus and since improper or inaccurate switching on of the gradient coils would destroy the accuracy of the derived imaging information. In other words, the operations for switching on and off the appropriate gradients can only be carried out for one of the sequences P1 or P2 at a time. As noted above, since the length of time for carrying out the P1 and P2 operations is $TS_1$ and $TS_2$, respectively, and since the overall repetition interval is divided into intervals TS equal to $TS_1 + TS_2$, during each interval TS there will be sufficient time to carry out one P1 operation and one P2 operation.

Further, the operations P1 and P2 are carried out during each time interval TS for different slices in order to maintain the proper spacing or timing of the respective P1 and P2 operations for any one slice. The requirement that each P1 operation for the various different slices during each repetition only be applied during a portion of the repetition sequence in which no other pulse P1 or P2 operation is carried out does place restrictions on selection of the recovery time intervals $TR_1$ and $TR_2$. In the preferred embodiment illustrated in FIG. 2, $TR_1$ is 500 milliseconds and $TR_2$ is 1,750 milliseconds to provide a total repetition rate $T_{rep}$ equal to 2,250. Since TS in the preferred embodiment is chosen as 150 milliseconds (50 milliseconds for P1 and 100 milliseconds for P2), $T_{rep}$ divided by TS equals 15 slices. With these parameters, a suitable timing for the respective P1 and P2 operations is illustrated in FIG. 2 so that a P1 operation is applied at the beginning of each TS interval and a P2 operation is applied during the second part of each TS interval. However, for a $TR_1$ of 500 milliseconds and a $TR_2$ of 2,000 milliseconds, $TR_2$ is an integral multiple of $TR_1$. This would result in spacing of the P2 and P1 operations both at the beginning of a sequence interval TS. On the other hand, a $TR_1$ of 500 milliseconds and a $TR_2$ of 2,050 milliseconds could be chosen, in which event T1-weighted image data and T2-weighted image data in accordance with the present invention can be obtained for 17 slices (2,550 milliseconds divided by 150 milliseconds).

It should also be noted that although in the embodiment shown in FIG. 2, a P1 operation is carried out during the first part of each time interval TS, whereas a P2 operation for a different slice is carried out during the second part of each time interval TS, the ordering could be reversed so that the P2 operations are carried out during the first part of the sequence time intervals TS and the P1 operations carried out during the latter portion of the sequence time intervals TS. It should also be appreciated with respect to FIG. 2 that for each of the different slices, the respective RF pulses (i.e., the 90° excitation pulses and the 180° rephasing pulses) are each applied with the respective predetermined frequency to satisfy resonance conditions. Thus, for slice No. 1, the 90° RF and 180° RF pulses are applied for each of the operations P1 and P2 with the frequency $f_1$, whereas for slice No. 2, the 90° and 180° RF pulses for each of the operations P1 and P2 would be applied with the frequency $f_2$, etc.

Further, it should be appreciated from FIG. 2 that the repetition sequence for one of the slices, for example slice No. 8, comprises an initial P1 operation followed by a P2 operation, whereas the repetition sequence for another slice, for example slice No. 1, comprises a P2 operation followed by a P1 operation. Thus, the ordering of the P1 and P2 operations within each repetition sequence can be, and generally is different for certain of the different slices. The only requirement is that the 90° RF excitation pulse for the P1 operation follows at an interval $TR_1$ after a preceding excitation pulse for a P2 operation, and that application of the 90° RF excitation for a P2 sequence follows at an interval of $TR_2$ after the 90° RF excitation pulse is applied in a preceding P1 operation. It will also be appreciated with reference to FIG. 2 that respective frequencies for the different slices and the ordering of the respective P1 and P2 operations is spaced so as to skip adjacent slices in order to minimize cross talk between the signals, as is known in connection with conventional multi-slice imaging techniques.

It will thus be appreciated that in accordance with the present invention, imaging data for T1-weighted NMR images and T2-weighted NMR images are each obtained with respect to a plurality of planes of an object during the course of a single scan and in which the number of planes for which T1a-weighted and T2-weighted NMR imaging data is obtained is the same and in which the time for completing the scan is reduced significantly as compared to conventional techniques. In this regard, the time for completing the scan is proportional to the number of phase encoding levels N times the overall repetition rate $T_{rep}$, or $N(TR_1+TR_2)$. With conventional techniques for obtaining T1-weighted and T2-weighted images in a multiple number of planes, using a $TR_1$ repetition rate for T1-weighted imaging data, a $TR_2$ repetition rate for T2-weighted imaging data and N phase encoding levels, since an additional T1-weighted scan would be required to obtain T1-weighted images for the same number of planes as those for which T2-weighted imaging data was obtained, the scanning time would be proportional to at least $N(TR_2+2TR_1)$. Consequently, in accordance with the present invention, the total scanning time is reduced by the time required for additional T1-weighted scans.

Furthermore, since the T1-weighted and T2-weighted images for multiple planes are obtained in the course of a single scan, with the present invention no additional time associated with performing additional scans on patients is required. For example, with conventional techniques, additional time to complete the required scans is generally required for placement of a patient in the NMR imaging apparatus for each scan, and for setting up the operator controls and loading of sequences, etc. for each scan, as well as allowing the patient to rest between scans. In this regard, at least three separate scans are required with conventional techniques. Thus, conventionally, on the order of a total of forty-five minutes is required to scan patients for obtaining T2-weighted and T1-weighted images for on the order of 15 different planes within the patient. On the other hand, with the present invention, the time required is on the order of only thirty minutes. Consequently, with the present invention, significantly increased patient throughput is provided, as well as less demand being placed on the patient and operators.

Still further, it will be appreciated that in accordance with the present invention, true T1-weighted and T2-weighted images are obtained with respect to a multiple number of planes. In this regard, the image contrast variation provided in accordance with the various obtained images is greater than is provided with imaging sequences using multiple echo techniques in which multiple images are obtained with respect to different echoes in a multiple echo imaging technique. For instance, in a multiple echo imaging technique, imaging data can be collected for echo times of 28, 56, 84 and 112 milliseconds. Although the echo times are variable, the repetition rate for each echo is the same. consequently, only the equivalent of T2-weighted images (for the larger echo times) can be obtained. None of the images would correspond to or be equivalent to T1-weighted images. Therefore, the contrast variation obtained with respect to standard multi-echo sequences is less than that obtained in accordance with the present invention.

It will also be appreciated that in accordance with the present invention as described above, the TR and TE times for the respective pulsing operation P1 and P2 can be varied as desired. For instance, typically for T1-weighted NMR images, a $TE_1$ of 28 milliseconds is utilized, and the $TR_1$ can vary from on the order of 350 milliseconds to 600 milliseconds. In some instances, a $TE_1$ of as low as 14 milliseconds can be utilized, in which the $TR_1$ for a T1-weighted image would be on the order of 200 milliseconds to 600 milliseconds. On the other hand, for T2-weighted NMR images, typically a $TE_2$ of 84 milliseconds is utilized, and the corresponding $TR_2$ should preferrably range from 1,500 milliseconds to 3,000 milliseconds. Again, the $TE_2$ for a T2-weighted image could be shorter, such as 56 milliseconds, in which the $TR_2$ should preferrably be on the order of 1,500–3,000 milliseconds, or the $TE_2$ could be longer such as 112 milliseconds in which the $TR_2$ should be on the order of 2,000–3,000 milliseconds.

Still further, it will be appreciated that since the T1-weighted and T2-weighted NMR image data is obtained during the same scan, corresponding T1-weighted and T2-weighted images are obtained for each of the same slices in order to enable an accurate comparison of the T1-weighted and T2-weighted images for the same areas of the patient and thus provide different types of information to a physician interpreting the images. This was not always possible with conventional techniques which required rescanning of the patient to obtain T1-weighted images after obtaining a first set of T2-weighted images for various planes or slices of the patient. With such conventional prior art techniques in which separate scans are performed, the images might be provided at slightly different planes and/or show variations as a result of patient movement between respective scans.

Furthermore, it will be appreciated that the principles employed in the present invention can also be employed for obtaining other than T1-weighted and T2-weighted images in a multiple number of planes, such as in connection with flow studies, and thus realize the same benefits of reduced scan times. This can be accomplished in accordance with the present invention by utilizing different repetition rates $TR_1$ and $TR_2$, with or without different echo times $TE_1$ and $TE_2$, in the repetition sequences than those utilized for T1-weighted and-/or T2-weighted images. In such instances, the overall scanning time will be minimized in comparison to the scanning times which would be required using conventional techniques. Still further, the principles of the present invention can also be utilized for obtaining more than two sets of NMR imaging data for multiple number of planes by employing repetition sequences having three or more sets of NMR excitation and reading operations, in which the respective excitation operations are performed at different intervals of time after a preceding excitation operation.

Finally, as noted hereinabove, while spin-echo imaging techniques are employed in accordance with the preferred embodiments, a similar technique in which separate pulsing operations for T1-weighted and T2-weighted images are combined for each repetition sequence could be utilized with respect to other conventional NMR signals, such as free induction decay (FID) NMR signals. Further, the present invention could be used with respect to NMR signals which are based on multi-echo techniques, i.e. with respect to multiple NMR signals being produced for each excitation pulse. Still further, the present invention can be utilized with other conventional techniques for encoding of spatial information into the collection of Ti-weighted and T2-weighted NMR signals. Further still, the present invention can be employed with respect to multi-slice image techniques for obtaining images at an oblique angle with respect to one of the magnetic field gradients. Additionally, the present invention can be used with conventional averaging techniques in which each repetition sequence is repeated a number of times to derive average NMR signal values for each pixel which are then used to produce images.

Thus, it will be understood that the embodiment described herein is merely exemplary and that persons skilled in the art may make many variations and modifications without departing from the spirit and scope of the invention. All such modifications and variations are intended to be included within the scope of the present invention as defined in the appended claims.

What is claimed is:

1. A method for obtaining T1-weighted and T2-weighted NMR image data for a plurality of selected planes in an object in the course of a single scan using nuclear magnetic resonance techniques, said method comprising:
   a. positioning an object in a static homogeneous magnetic field;
   b. obtaining NMR imaging data for a T1-weighted image and a T2-weighted image in a first selected plane of said object by subjecting said object to a plurality of repetitions of a repetition sequence composed of NMR excitation and magnetic field gradient pulses, each repetition sequence including (i) applying a first excitation pulse and reading out a first NMR signal produced by said first excitation pulse at a time $TE_1$ after said first excitation pulse, and (ii) applying a second excitation pulse and reading out a second NMR signal produced by said second excitation pulse at a time $TE_2$ after said second excitation pulse, said first and second excitation pulses each being applied in a manner so as to only excite selected nuclei in said first selected plane of said object, said first excitation pulse being applied during said repetition sequence after a recovery time interval $TR_1$ from a preceding excitation pulse and second excitation pulse being applied during said repetition sequence after a recovery time interval $TR_2$ from a preceding excitation pulse, said repetition sequence being repeated at a repetition time interval $T_{rep}$ which is equal to the sum of said $TR_1$ and $TR_2$ intervals, and said plurality of repetitions of said repetition sequence being carried out in a manner to encode spatial information into a collection of said first and second NMR signals to obtain said NMR image data for a T1-weighted image and a T2-weighted image for said first selected plane, said $TE_1$ and $TR_1$ being selected so that said collection of said first NMR signals is representative of T1-weighted imaging data, and said $TE_2$ and $TR_2$ being selected so that said collection of said second NMR signals is representative of T2-weighted imaging data; and
   c. carrying out step (b) set forth above for at least one additional selected plane of said object to obtain NMR imaging data for T1-weighted and T2-weighted images for said at least one additional selected plane, said repetition time interval $T_{rep}$ at which said repetition sequence is repeated for said at least one additional selected plane being substantially the same as said repetition time interval $T_{rep}$ at which said repetition sequence is repeated for said first selected plane, each of said first and second excitation pulses for each repetition of said repetition sequence for said at least one additional selected plane being applied in a manner so as to only excite selected nuclei in said at least one additional selected plane, and each step (i) for each repetition of said repetition sequence for said at least one additional selected plane being carried out during the corresponding repetition of said repetition sequence for said first selected plane at a different portion of said repetition time interval $T_{rep}$ for said first selected plane than said step (i) for said first selected plane, and each step (ii) for each repetition of said repetition sequence for said at least one additional selected plane being carried out during the corresponding repetition of said repetition sequence for said first selected plane at a different portion of said repetition time interval $T_{rep}$ for said first selected plane than said step (ii) for said first selected plane.

2. The method of claim 1 wherein said first selected plane and said at least one additional selected plane are parallel to one another; wherein said first and second excitation pulses of said repetition sequence for each of said selected planes are each applied in the presence of a slice selector magnetic field gradient which has a gradient direction extending along a first direction which is perpendicular to said selected planes; and wherein said first and second excitation pulses of said repetition sequence for each selected plane are applied at a predetermined frequency chosen according to the strength of the magnetic field imposed by said static homogeneous magnetic field and said slice selector magnetic field gradient of said each selected plane so that said first and second excitation pulses of said repetition sequence for said each selected plane only excite selected nuclei of said object in said each selected plane, said predetermined frequencies applied for each of said selected planes being different from one another.

3. The method of claim 2 wherein the operations of reading out said first and second NMR signals for each repetition of said repetition sequence for each of said selected planes are carried out in the presence of a read out magnetic field gradient which has a gradient direction extending along a second direction which is perpendicular to said first direction to encode spatial information along said gradient direction of said read out magnetic field gradient into said collection of said first and second NMR signals for said each selected plane.

4. The method of claim 3 further including, during each repetition of said repetition sequence for each of said selected planes, the step of applying a phase encoding magnetic field gradient intermediate the application of said first excitation pulse and reading out said first NMR signal and intermediate the step of applying said second excitation pulse and reading out said second NMR signal, said phase encoding magnetic field gradient having a gradient direction extending along a third direction which is perpendicular to said first and second directions, and the amplitude of said phase encoding magnetic field gradient being variable for said repetitions of said repetition sequence for each of said selected planes so as to encode spatial information along said third direction into said collection of said first and second NMR signals for said each selected plane.

5. The method of claim 4 wherein said slice selector, read out and phase encoding gradients are switched on and off during said single scan of said object so that said slice magnetic field gradient is on during application of said excitation pulses, said read out gradient is on during reading out of said NMR signals and said phase encoding gradient is on intermediate said application of said excitation pulses and its respective reading out of said NMR signals.

6. The method of claim 1 wherein said step (c) is carried out for a plurality of additional selected planes.

7. The method of claim 6 wherein the time interval for carrying out said step (i) for each repetition of said repetition sequence is $TS_1$ and wherein the time interval for carrying out said step (ii) during each repetition of said repetition sequence is $TS_2$; and wherein the number of times said step (c) is carried out is n-1, in which n is an integral number less than or equal to $T_{rep}$ divided by the sum of $TS_1$ and $TS_2$.

8. The method of claim 7 wherein said sequence time interval $TS_1$ corresponds to the time interval for applying said excitation pulse and its respective reading out of said NMR signals and for switching on and off said magnetic field gradients during said step (i) of said repetition sequence, and wherein said sequence time interval $TS_2$ corresponds to the time interval for applying second excitation pulse and its respective reading out of said second NMR signal and for switching on and off said magnetic field gradients during said step (ii) of said repetition sequence.

9. The method of claim 8 wherein $TS_1$ is between 30-60 msec. and $TS_2$ is between 60-120 msec.

10. The method of claim 9 wherein the number of times said step (c) is carried out is at least nine.

11. The method of claim 8 wherein the repetition time interval $T_{rep}$ is divided into a plurality of sequence time intervals TS corresponding to the number of selected planes for which NMR imaging data is to be obtained, said sequence time interval TS being equal to the sum of $TS_1$ and $TS_2$; and wherein during each of said intervals TS, one of said steps (i) for one of said selected planes and one of said steps (ii) for another of said selected planes are carried out during different portions of said sequence time interval TS.

12. The method of claim 1 further including, during each repetition of said repetition sequence for each of said selected planes, the step of applying a first rephasing pulse at a time interval equal to one-half of $TE_1$ after application of said first excitation pulse, and applying a rephasing pulse at a time interval equal to one-half of $TE_2$ after application of said second excitation pulse, whereby said first and second NMR signals are each spin-echo NMR signals.

13. The method of claim 12 wherein said step of applying said rephasing pulses during each repetition for each of said selected planes comprises applying said rephasing pulses at a frequency corresponding to said predetermined frequency at which said first and second excitation pulses are applied for said each selected plane.

14. The method of claim 1, wherein $TE_1$ is less than $TE_2$ and $TR_1$ is less than $TR_2$.

15. The method of claim 14 wherein $TE_1$ is short compared to the T2 values expected to be present in said object, and wherein $TE_2$ corresponds to the T2 values expected to be present in said object.

16. The method of claim 15 wherein $TR_1$ corresponds to the T1 values expected to be present in the object and $TR_2$ is long in comparison to the T1 values expected to be present in said object.

17. The method of claim 16 wherein $TE_1$ is between 14 and 28 msec., and $TR_1$ is between 200 and 600 msec., and wherein $TE_2$ is between 56 and 112 msec. and $TR_2$ is between 1,500 and 3,000 msec.

18. The method of claim 1 wherein said step (ii) is carried out prior to said step (i) during each repetition of said repetition sequence for at least one of said selected planes.

19. The method of claim 1 wherein said step (i) is carried out prior to said step (ii) during each repetition of said repetition sequence for at least one of said selected planes.

20. The method of claim 19 wherein said step (ii) is carried out prior to said step (i) during each repetition of said repetition sequence for another of said selected planes.

21. A method for obtaining T1-weighted and T2-weighted NMR image data for at least two selected planes in an object in a single scan using nuclear magnetic resonance techniques, said method comprising:
  positioning an object in an NMR imaging apparatus which includes means for generating a magnetic field, means for exciting selected nuclei to generate NMR signals and for reading of such NMR signals to provide a collection of NMR signals from selected regions of an object placed in said NMR imgaging apparatus, and means for obtaining NMR imaging data from said collection of NMR signals;
  conducting a plurality of NMR sampling operations to obtain NMR imaging data from a first selected plane of said object, said step of conducting said sampling operations for said first plane being commenced at a first time during the course of a single scan and being continued substantially throughout said single scan so as to obtain NMR imaging data for producing T1-weighted and T2-weighted images for said first selected plane of said object;

conducting a plurality of NMR sampling operations to obtain NMR imaging data from a second selected plane of said object which is different from said first selected plane, said step of conducting said sampling operations for said second selected plane being commenced at a second time during the course of said single scan which is later than said first time but prior to completion of said step of conducting said sampling operations for said first selected plane, and said step of conducting said NMR sampling operations for said second selected plane being continued substantially throughout said single scan to obtain NMR imaging data for producing T1-weighted and T2-weighted images for said second selected plane;

each of said plurality of NMR sampling operations including first and second sets of NMR excitation and reading operations, one of said first and second sets of NMR excitation and reading operations being performed in a manner to provide T1-weighted NMR imaging data and the other of said first and second sets of excitation and reading operations being performed in a manner to provide T2-weighted imaging data;

and each of said first set of operations being performed at a different time during the course of said single scan than each other of said first set of operations and each of said second set of operations, and each of said second set of operations being performed at a different time during the course of said single scan than each other of said second set of operations and each of said first set of operations.

22. The method of claim 21 wherein said steps of conducting a plurality of NMR sampling operations each comprise subjecting said object to a plurality of repetitions of a repetition sequence comprised of NMR excitation and magnetic field gradient pulses, each of said repetition sequences constituting one of said NMR sampling operations.

23. The method of claim 22 wherein each of said repetition sequences includes the steps of (i) applying a first excitation pulse and reading out a first NMR signal produced by said first excitation pulse at a time $TE_1$ after said first excitation pulse, and (ii) applying a second excitation pulse and reading out a second NMR signal produced by said second excitation pulse at a time $TE_2$ after said second excitation pulse, said first and second excitation pulses for each of said selected planes each being applied in a manner so as to only excite selected nuclei in said each selected plane of said object, said first excitation pulse being applied during said repetition sequence after a recovery time interval $TR_1$ from a preceding second excitation pulse and said second excitation pulse being applied during said repetition sequence after a recovery time interval $TR_2$ from a preceding first excitation pulse, said repetition sequence for said each selected plane being repeated at a repetition time interval $T_{rep}$ which is equal to the sum of said $TR_1$ and $TR_2$ intervals; wherein said plurality of repetitions of said repetition sequence for said each selected plane are carried out in a manner to encode spatial information into a collection of said first and second NMR signals for each selected plane, said $TE_1$ and $TR_1$ being selected so that said collection of said first NMR signals is representative of T1-weighted imaging data, and said $TE_2$ and $TR_2$ being selected so that said collection of said second NMR signals is representative of T2-weighted imaging data; and wherein each step (i) for each repetition of said repetition sequence for said second selected plane is carried out during the corresponding repetition of said repetition sequence for said first selected plane at a different portion of said repetition time interval $T_{rep}$ for said first selected plane than said step (i) for said first selected plane, and each step (ii) for each repetition of said repetition sequence for said second selected plane is carried out during the corresponding repetition of said repetition sequence for said first selected plane at a different portion of said repetition time interval $T_{rep}$ for said first selected plane than said step (ii) for said first selected plane.

24. The method of claim 23 wherein said first and second selected planes are parallel to one another; wherein said first and second excitation pulses of said repetition sequence for each of said selected planes are each applied in the presence of a slice selector magnetic field gradient which has a gradient direction extending along a first direction which is perpendicular to said selected planes; and wherein said first and second excitation pulses of said repetition sequence for each selected plane are applied at a predetermined frequency chosen according to the strength of the magnetic field imposed by said static homogeneous magnetic field and said slice selector magnetic field gradient of said each selected plane so that said first and second excitation pulses of said repetition sequence for said each selected plane only excite selected nuclei of said object in said each selected plane, said predetermined frequencies applied for each of said selected planes being different from one another.

25. The method of claim 24 wherein the operations of reading out said first and second NMR signals for each repetition of said repetition sequence for each of said selected planes are carried out in the presence of a read out magnetic field gradient which has a gradient direction extending along a second direction which is perpendicular to said first direction to encode spatial information along said gradient direction of said read out magnetic field gradient into said collection of said first and second NMR signals for said each selected plane.

26. The method of claim 25 further including, during each repetition of said repetition sequence for each of said selected planes, the step of applying a phase encoding magnetic field gradient intermediate the application of said first excitation pulse and reading out said first NMR signal and intermediate the step of applying said second excitation pulse and reading out said second NMR signal, said phase encoding magnetic field gradient having a gradient direction extending along a third direction which is perpendicular to said first and second directions, and the amplitude of said phase encoding magnetic field gradient being variable for said repetitions of said repetition sequence for each of said selected planes so as to encode spatial information along said third direction into said collection of said first and second NMR signals for said each selected plane.

27. The method of claim 26 wherein said slice selector, read out and phase encoding gradients are switched on and off during said single scan of said object so that said slice magnetic field gradient is on during application of said excitation pulses, said read out gradient is on during reading out of said NMR signals and said phase encoding gradient is on intermediate said application of said excitation pulses and its respective reading out of said NMR signals.

28. The method of claim 23 further including conducting a plurality of NMR sampling operations for a plurality of additional selected planes.

29. The method of claim 28 wherein the time interval for carrying out said step (i) for each repetition of said repetition sequence is $TS_1$ and wherein the time interval for carrying out said step (ii) during each repetition of said repetition sequence is $TS_2$, and wherein the number of selected planes for which said plurality of NMR sampling operations are conducted is an integral number less than or equal to $T_{rep}$ divided by the sum of $TS_1$ and $TS_2$.

30. The method of claim 29 wherein said sequence time interval $TS_1$ corresponds to the time interval for applying said excitation pulse and its respective reading out of said NMR signals and for switching on and off said magnetic field gradients during said step (i) of said repetition sequence, and wherein said sequence time interval $TS_2$ corresponds to the time interval for applying said second excitation pulse and its respective reading out of said second NMR signal and for switching on and off said magnetic field gradients during said step (ii) of said repetition sequence.

31. The method of claim 30 wherein the repetition time interval $T_{rep}$ is divided into a plurality of sequence time intervals TS corresponding to the number of selected planes for which NMR imaging data is to be obtained, said sequence time interval TS being equal to the sum of $TS_1$ and $TS_2$; and wherein during each of said intervals TS, one of said steps (i) for one of said selected planes and one of said steps (ii) for another of said selected planes are carried out during different portions of said sequence time interval TS.

32. A method for obtaining first and second NMR imaging data for at least two selected planes in an object in a single scan using nuclear magnetic resonance techniques, said method comprising:

positioning an object in an NMR imaging apparatus which includes means for generating a magnetic field, means for exciting selected nuclei to generate NMR signals and for reading of such NMR signals to provide a collection of NMR signals from selected regions of an object placed in said NMR imaging apparatus, and means for obtaining NMR imaging data from said collection of NMR signals;

conducting a plurality of NMR sampling operations to obtain NMR imaging data from a first selected plane of said object, said step of conducting said sampling operations for said first plane being commenced at a first time during the course of a single scan and being continued substantially throughout said single scan so as to obtain NMR imaging data for producing first and second images for said first selected plane of said object;

conducting a plurality of NMR sampling operations to obtain NMR imaging data from a second selected plane of said object which is different from said first selected plane, said step of conducting said sampling operations for said second selected plane being commenced at a second time during the course of said single scan which is later than said first time but prior to completion of said step of conducting said sampling operations for said first selected plane, and said step of conducting said NMR sampling operations for said second selected plane being continued substantially throughout said single scan to obtain NMR imaging data for producing first and second images for said second selected plane;

each of said plurality of NMR sampling operations including a first NMR excitation operation followed by a first NMR reading operation and a second NMR excitation operation followed by a second NMR reading operation, said first NMR excitation operations being performed at a first interval of time after a preceding NMR excitation operation to provide first NMR imaging data for producing said first images and said second NMR excitation operation being performed at a second interval of time after a preceding first NMR excitation operation to provide second NMR imaging data for producing said second images, said first interval of time being different from said second interval of time, whereby the overall time for obtaining said first and second NMR imaging data for said first and second selected planes is minimized.

* * * * *

UNITED STATES PATENT AND TRADEMARK OFFICE
CERTIFICATE OF CORRECTION

PATENT NO. : 4,734,646

DATED : March 29, 1988

INVENTOR(S) : Shenoy et al.

It is certified that error appears in the above-identified patent and that said Letters Patent is hereby corrected as shown below:

Column 1, line 9, after "resonance", delete --magnetic resonance--.
Column 6, line 9, "conventioal" should read --conventional--.
line 63, "seconds" should read --second--.
Column 13, line 41, "spin-echol" should read --spin-echo--.
Column 14, line 13, after "of", insert --a--;
line 18, "internal" should read --interval--.
Column 16, line 38, "change" should read --chance--.
Column 18, line 26, "pulses" should read --pulse--;
line 35, "pules" should read --pulse--;
line 50, delete "at" and insert --a--.
Column 19, line 15, delete "is" (first occurrence) and insert therefor --it--.
Column 20, line 44, after "pulse", insert --therefor--.
Column 21, line 19, "inerval" should read --interval--;
line 36, "equal" should read --equals--;
line 37, "equal" should read --equals--.
Column 22, line 8, delete "$\bar{f}$" and insert therefor --"--.
Column 23, line 12, "$_1$," should read --$f_1$,--;
line 27, after "excitation", insert --pulse--.

Signed and Sealed this

Sixth Day of September, 1988

*Attest:*

DONALD J. QUIGG

*Attesting Officer*   *Commissioner of Patents and Trademarks*